Figure 1:
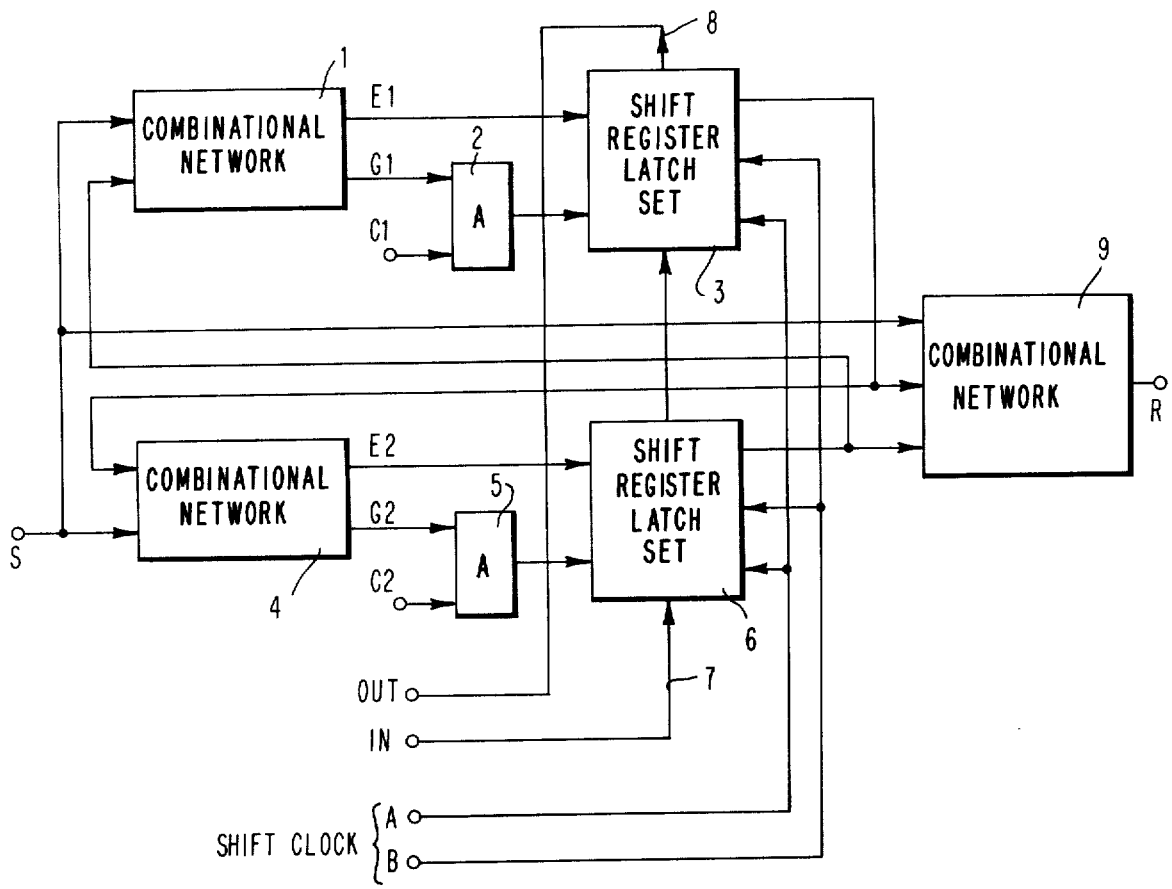

United States Patent [19]

Eichelberger et al.

[11] 4,071,902
[45] Jan. 31, 1978

[54] REDUCED OVERHEAD FOR CLOCK TESTING IN A LEVEL SYSTEM SCAN DESIGN (LSSD) SYSTEM

[75] Inventors: Edward Baxter Eichelberger, Purdy Station, N.Y.; Thomas Walter Williams, Longmont, Colo.

[73] Assignee: International Business Machines Corporation, Armonk, N.Y.

[21] Appl. No.: 701,053

[22] Filed: June 30, 1976

[51] Int. Cl.² ............................................. G06F 7/38
[52] U.S. Cl. ............................... 364/716; 307/221 R; 364/900
[58] Field of Search ................ 235/152, 156; 307/203, 307/207, 221 R; 340/172.5

[56] References Cited

U.S. PATENT DOCUMENTS 3,851,187 11/1974 Pao et al. ......................... 307/221 R
3,983,538 9/1976 Jones ............................... 340/172.5

OTHER PUBLICATIONS

J. E. Elliott et al. "Array Logic Processing" *IBM Tech. Disclosure Bulletin* vol. 16, No. 2 July 1973, pp. 586–587.

*Primary Examiner*—David H. Malzahn
*Attorney, Agent, or Firm*—Wesley DeBruin

[57] ABSTRACT

The disclosure relates to LSSD systems for use in digital computers and the like. More particularly, to an organization of logic in such systems to render the clock networks testable with minimal overhead. The advantages of the practice of the invention are particularly apparent and enhanced when the invention is employed in a Level Sensitive Scan Design (LSSD) System generally of the type disclosed in U.S. Pat. No. 3,783,254 and U.S. patent application Ser. No. 701,052, filed June 30, 1976.

14 Claims, 2 Drawing Figures

(FIGS. 1 AND 2 CORRESPOND TO FIG.7 AND FIG.8 OF U.S. PATENT NO. 3,783,254)

REDUCED OVERHEAD FOR CLOCK TESTING IN A LEVEL SYSTEM SCAN DESIGN (LSSD) SYSTEM

BACKGROUND OF THE INVENTION

Field of the Invention This invention relates to LSSD logic systems for use in digital computers and the like. More particularly, to an organization of logic in such systems to render the clock networks testable with minimal overhead. The advantages of the practice of the invention are particularly apparent and enhanced when the invention is employed in a Level Sensitive Logic System generally of the type disclosed in U.S. Pat. No. 3,783,254.

CROSS-REFERENCE TO RELATED APPLICATIONS AND PATENTS

U.S. patent application Ser. No. 701,052 entitled "Level Sensitive Embedded Array Logic System", filed June 30, 1976, by Messrs. E. B. Eichelberger, E. I. Muehldorf, R. G. Walther and T. W. Williams, and of common assignee.

U.S. patent application Ser. No. 701,054 entitled "Method of Level Sensitive Testing A Functional Logic System with Embedded Array", filed June 30, 1976, by Messrs. E. G. Eichelberger, E. I. Muehldorf, R. G. Walther and T. W. Williams, and of common assignee.

U.S. patent application Ser. No. 701,376, entitled "Clock Generation Network", filed June 30, 1976, by Messrs. E. B. Eichelberger, and S. Das Gupta and of common assignee.

U.S. patent application Ser. No. 589,231 entitled "High Density Semiconductor Chip Organization", by E. B. Eichelberger and G. J. Robbins, filed June 23, 1975 granted as U.S. Pat. No. 4,006,492 on Feb. 1, 1977, and of common assignee.

U.S. patent application Ser. No. 701,055, entitled "Implementation of Level Sensitive Logic System Accordion Register Means" by Hau-Tung Lee, filed June 30, 1976 and of common assignee.

U.S. patent application Ser. No. 701,041, entitled "Method of Propagation Delay Testing A Level Sensitive Embedded Array Logic System" by E. B. Eichelberger, E. I. Muehldorf, R. G. Walther and T. W. Williams, filed June 30, 1976 and of common assignee.

U.S. patent application Ser. No. 534,606, filed Dec. 20, 1974, entitled "Testing Embedded Arrays", by E. B. Eichelberger, granted as U.S. Pat. No. 3,961,252 on June 1, 1976 and of common assignee.

U.S. patent application Ser. No. 534,608, entitled "Testing Embedded Arrays", by J. R. Cavaliere and R. Robortaccio, filed Dec. 20, 1974, granted as U.S. Pat. No. 3,961,254 on June 1, 1976 and of common assignee.

U.S. patent application Ser. No. 534,605, entitled "Testing Embedded Arrays" filed Dec. 20, 1974, by W. P. Hurley and H. P. Muhlfeld, granted as U.S. Pat. No. 3,961,251 on June 1, 1976 and of common assignee.

U.S. Pat. No. 3,783,254, entitled "Level Sensitive Logic System", application Ser. No. 297,543, filed Oct. 12, 1972 granted Jan. 1, 1974 to Edward B. Eichelberger and of common assignee.

U.S. Pat. No. 3,761,695 entitled, "Method of Level Sensitive Testing a Functional Logic System", application Ser. No. 298,087, filed Oct. 16, 1972, granted Sept. 25, 1973 to Edward B. Eichelberger and of common assignee.

U.S. Pat. No. 3,784,907, entitled "Method of Propagation Delay Testing a Functional Logic System", application Ser. No. 298,071, filed Oct. 16, 1972, granted Jan. 8, 1974 to Edward B. Eichelberger and of common assignee.

DESCRIPTION OF THE PRIOR ART

In the past, the designer of computer logic has had complete flexibility in arranging logic circuitry to implement system and sub-system logic functions in central processing units, channels and control units employed in digital computing apparatus. A significant variety of design implementations has resulted from the exercise of this flexibility. Each of these implementations has its own special dependency on the ac characteristics of the individual circuits employed in the system.

The independence and flexibility characterizing the arrangements of the designer often led to unexpected system timing problems, complicated and complex problems in testing the circuitry, and a significant complexity and detail required for educating the field service personnel for such computing systems. However, it had the advantage of permitting the designer to use all techniques to obtain the best performance by employing the fewest number of circuits. The interface between the logic designer and the component manufacturer was reasonably well defined and the approach of the past could be supported in component manufacturing since the ac parameters such as rise time, fall time, individual circuit delay, etc., could rather readily be tested.

With the advent of larger scale integration, however, this well defined and reliably tested interface no longer exists. It has become impossible or impractical to test each circuit for all of the well known ac circuit parameters. As a result, it is necessary to partition and divide logic systems and sub-systems into functional units having characteristics that are substantially insensitive to these parameters.

One method of obtaining this structure in digital systems is to organize them in the manner described in U.S. Pat. No. 3,783,254, entitled "Level Sensitive Logic System" granted Jan. 1, 1974 to Edward B. Eichelberger on application Ser. No. 297,543 filed Oct. 16, 1972 and of common assignee herewith. When this is done, the resulting digital system will have the general form shown in FIG. 1. The disclosure of U.S. Pat. No. 3,783,254 is incorporated herein by reference thereto to the same extent as though it was expressly set forth herein word for word.

This logic system operates in a synchronous manner under control of two non-overlapping clock trains, C1 and C2. When the C1 clock pulse occurs, data signals from the combinational network 1 are clocked into the latches in Shift Register Latch Set 3, and propagate through the combination networks 4,9. When these signals have finished propagating, the C2 clock pulse occurs and the data signals from 4 are clocked into the latches in Shift Register Latch Set 6. These latch signals, in turn, propagate through the combinational networks 1, 9. When these signals have finished propagating, the cycle is again initiated with the C1 clock pulse.

Figure 2:
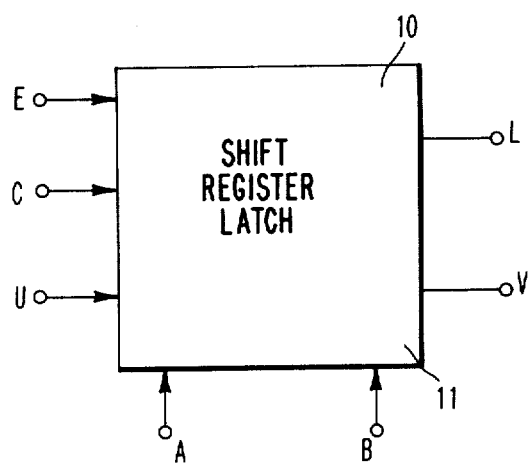

The Shift Register Latch Sets consist of one or more "Shift Register Latches" shown in FIG. 2. These are interconnected into a shift register controlled by the A and B shift clocks by connecting the V output of one cell to the U input of the next cell. Each Shift Register Latch contains two clocked latches L1 and L2. The first latch is controlled by two clock inputs, C and A. When the C clock input is pulsed, the value of the input signal E, is stored in the L1 latch. When the A clock input is pulsed, the value of the input signal U is stored in the L1 latch. The second latch L2 is controlled by the B clock such that when it is pulsed, the value of the L1 latch is stored in the L2 latch. The signals on output L and V correspond to the data stored in latches L1 and L2, respectively.

Logic systems with the structure generally as shown in FIG. 1 have many advantages over other logic systems. One of these advantages is the ability to fully test the structure in a race-free manner by controlling the clock inputs C1, C2, A, B and by using the shift registers to apply and measure test patterns.

Since this type of fully testable logic structure requires, as inputs, two synchronous trains of non-overlapping clock signals, C1 and C2, the logic system must also contain a network that generates these clock pulses. Such a clock generation network for a general logic structure that performs this function, itself being fully testable, and that can be made part of the logic system without changing the structure described in FIG. 1 is disclosed in afore-identified U.S. patent application Ser. No. 701,376. The invention disclosed and claimed herein, as will be more fully apparent hereinafer, permits gating the B shift clock whereby the logic designer may utilize in his logic design the L2 latch.

Figure 3:
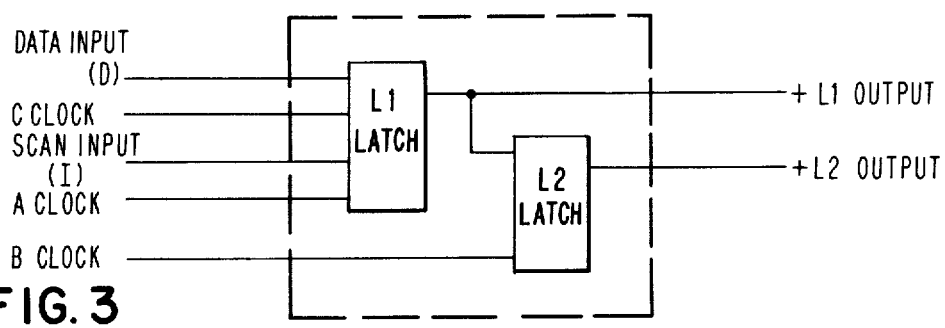

In the design of logic in accordance with the teaching set forth in U.S. Pat. No. 3,783,254, (granted Jan. 1, 1974, Ser. No. 297,543, filed Oct. 16, 1972, entitled "Level Sensitive Logic System" to Edward B. Eichelberger and assigned to the IBM Corporation), there were restrictions placed on the use of logic in the B shift clock network. The shift register latches as disclosed had both an L1 latch and an L2 latch as shown in FIG. 3. Since data is always captured in the latch L1 via the data input D or the scan input I the presence of clock gating can be tested with the normal procedures. These procedures are scan-in a pattern to all the SRLs. Note that the L1 latch and L2 latch of each SRL will have the same value in them. The pattern scanned in will gate, say the system clock "off" such that the system clock cannot get through to the L1 latch. Furthermore, the pattern scanned in will present a value to the SRL (either at the data port or the scan-in port) which is different than the value in the SRL such that if the clock gets through, then the value in the L1 latch will change. If the clock does not get through the SRL will not change state. Whether the SRL has changed state or not can be observed when scan-out is completed. This test can be derived by using a combinational test generator not a sequential one.

In the situation where the B-shift clock is gated a sequential generator would have to be used to test the gated B-shift clock. For example, assume a B-shift clock is gated by a gate G. In order to test if the gate is stuck "off" (the B-clock always gets through) a pattern must be scanned into the SRLs which control this gate such that the gate should be "on" (B-shift clock should not get through). The SRL where the gated B-shift clock is received has the same value scanned into both the L1 latch and L2 latch. Next a value, opposite that which is scanned into the SRL, is obtained at the input to the SRL which receives the gated B-shift clock.

These values are scanned into the SRLs at the same time that the SRLs are set up to control the gate of the B-shift clock. Now the SRLs are all set up, the gate should be "on", a C clock is turned on, then off, such that the L1 latch of the SRL, which receives the gated B-clock, will now have a different value in it as compared to SRLs L2 latch. After this sequential operation, the fault can now be tested by turning the B-shift clock on, then off, such that L2 latch will change if and only if the gate is stuck "off" (assuming single fault at most). Next, the SRLs are scanned out such that the L2 value of the SRL in question can be checked.

This type of operation does not lend itself to a simple combinational logic test by which all the other logic can be tested. The solution in the prior art is to require that whenever a B-shift clock was gated that the resulting gated clock must be driven to a primary output such that it could be tested with a simple combinational and observed.

Reference is made to U.S. Pat. No. 3,783,254. Summarized below are the Level Sensitive/Scan Design (LSSD) Rules that are followed for the chip and Field Replaceable Unit (FRU) to support testing.

The following LSSD rules apply to the chip and FRU logic circuits.

1. All internal storage is implemented in clocked DC latches (i.e., latches controlled by clock signals such that when the clock inputs ae 'off' the latch cannot be changed by other inputs).

2. The latches are controlled by two or more non-overlapping system clocks such that latches controlled by a clock, $C_i$, may not feed to other latches controlled by $C_i$.

3. All system latches are implemented as part of a Shift Register Latch (SRL). All SRL's will be interconnected into one or more shift registers, each of which has an input, an output and shift clocks A and B available at the terminals of the package.

4. System signals may be taken from any of the SRL outputs but outputs from the first and second latches of an SRL must not be both used as inputs to the same combinatorial logic function.

5. It must be possible to control all clocks from the input terminals of the package. That is, it must be possible to establish a primary input (PI) state that holds all clocks 'off' at the SRL macro inputs, and allows each of them to be turned 'on' and 'off' by changing a single primary input (PI) for each clock. It must also be possible to turn both shift clocks (A and B) 'on' simultaneously.

6. Clock signals may not be used as data inputs to latches but may only feed the clock inputs to the latches.

7. If the clock network which controls the L2 latch is other than a simple powering tree fed from a single primary input (PI), then the controlled (or derived) B clock signal must be fed to a primary output (PO). The resulting combinatorial logic network feeding this primary output (PO) must not be logically redundant.

Figure 4:
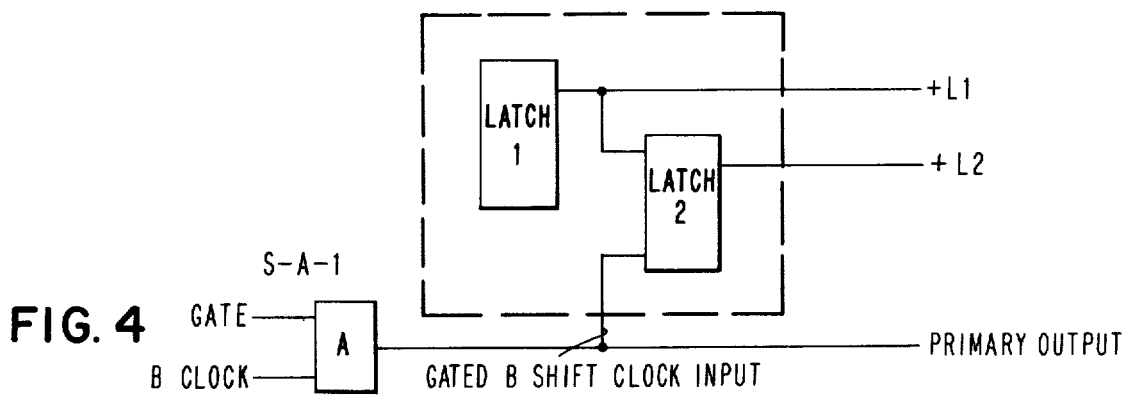

When designing a sequential network which follows the afore-recited Level Sensitive Scan Design (LSSD) rules, gating of the B-shift clock is frequently desirable and advantageous. When a B-shift clock is gated, the gated B-shift clock must be directed to a primary output rule 7, supra. If this net were not directed to a primary output then the gate input to the And block in FIG. 4 will not be tested for a "stuck-at-1" fault. If the B-shift clock is gated, for example, in 10 different ways, then 10 primary outputs must be used to satisfy rule 7. Or, a decode network may be employed which requires 4 primary inputs and a single primary output at the chip level. Assuming 12 logic blocks for the decode networks, one And block for each of the gated B-shift clock lines, and a single Or block, this method would require 23 logic blocks or about 2.3 logic blocks per gated B-shift clock.

Figure 5:
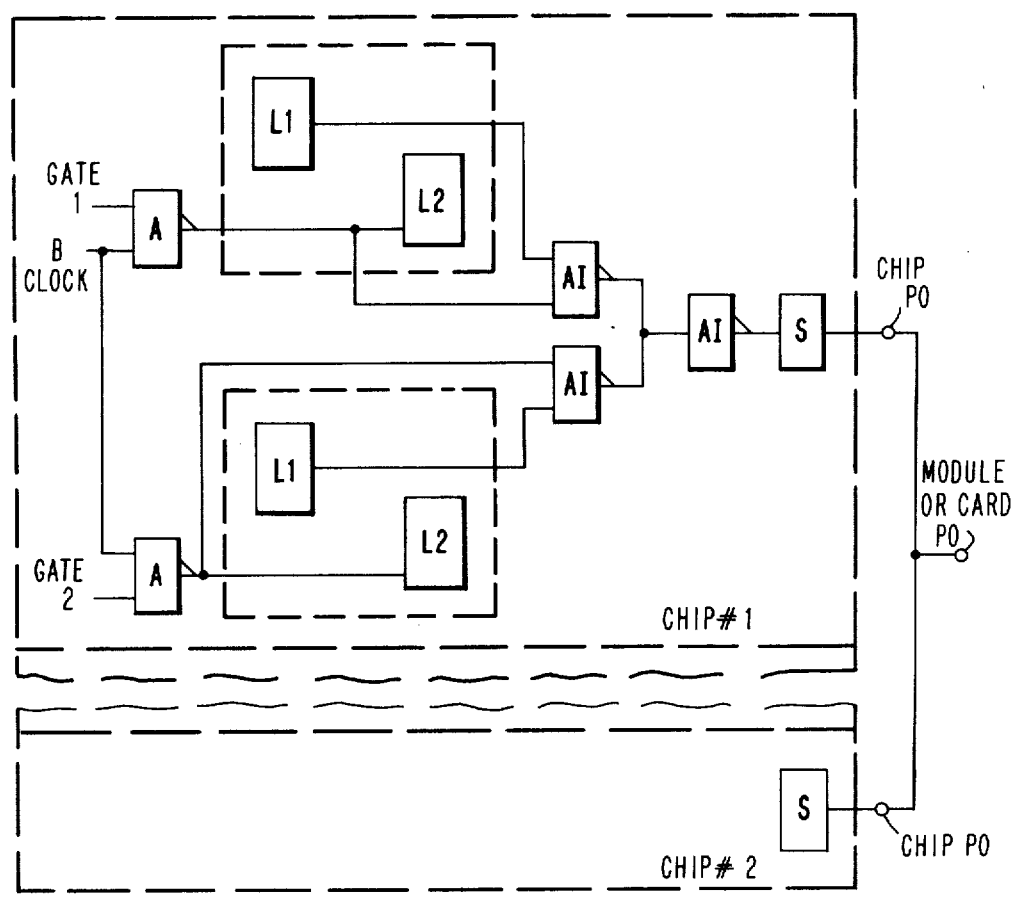

Applicants' invention provides an efficient novel manner in which gated B-shift clocks can be directed to a primary output, such that a complete stuck fault test can be obtained, with minimum additional circuitry. If a B-shift clock is gated, then the L1 output of an SRL is "Anded" with the gated B-shift clock, and all such outputs are "Ored" and sent to a primary output. FIG. 5 shows the required network when two different gated B-shift clocks are directed to a single primary output in accordance with the invention. This technique requires 1 primary output and 1.5 "And Invert" blocks per gated B-shift clock. If a chip had 10 gated B-shift clocks then this technique would require 1 primary output and 1.1 "And Invert" blocks per gated B-shift clock network.

When two or more chips of this type are placed on a module or card, these gated B-shift clock test points can also be "dotted" together and taken into a single module or card primary output as shown in FIG. 5.

Thus, this technique allows extensive B-shift clock gating to be done at the expense of: (a) slightly more than one circuit per gated B-shift clock; (b) one chip pad per chip; (c) one card or module pin.

While this invention has been particularly described with reference to the preferred embodiment thereof, it will be understood by those skilled in the art that the foregoing and other changes in form and details may be made therein without departing from the spirit and scope of the invention.

What is claimed is:

1. A functional logic unit comprising:
   a plurality of latches arranged in groups;
   means for generating a plurality of clock signal trains coupled to respective groups of said latches for controlling the latches;
   plural networks at least one of which is responsive to a set of unit input signals with each such network providing a set of network signal indications;
   means coupling the sets of network signal indications to respective groups of latches such that the indications are latched in the respective groups under the control of the respective clock signal trains;
   means coupling the outputs of the respective groups of latches as sets of inputs to all networks except a network coupled to a latch group controlled by the same clock signal train;
   means coupling the outputs of the latch groups for providing a logic unit output indication that is a function of said set of unit input signals and said indications in the respective groups of latches;
   further means interconnecting said plurality of latches arranged in groups into at least one shift register having a plurality of shift register stages, each of said stages of said shift register comprising a first latch and a second latch; and
   additional circuit means including AND circuit means connected to at least certain of said second latches for test purposes, whereby at least certain of said first and second latches are employed to perform a logical function in said functional logic unit and a test function in testing said unit.

2. A functional logic unit, said functional logic unit comprising:
   a plurality of latches;
   means for generating a plurality of clock signals trains selectively coupled to said latches for controlling the latches;
   plural logical combinational networks at least one of which is responsive to a set of unit input signals with each such network providing a set of network signal indications;
   means coupling the sets of network signal indications selectively to at least certain of said latches such that the indications are latched therein under the control of the respective clock signal trains;
   means coupling at least certain of the outputs of said latches as sets of inputs to all networks except a network controlled by the same clock signal train;
   output means coupled to at least certain of said plurality of latches and at least certain of said logical combinational networks for providing a functional logic unit output;
   said functional logic unit including the addition of logical circuitry interconnecting at least certain of said plurality of latches with an output terminal.

3. A functional logic unit as recited in claim 2, wherein said additional logical circuitry interconnecting at least certain of said plurality of latches with said output terminal comprises AND-INVERTER circuit means.

4. A functional logic unit as recited in claim 3, wherein said unit is contained on a semiconductor chip.

5. I a level sensitive scan design system of logic, a multi-position shift register, each position of said shift register comprising:
   a shift register latch (SRL) consisting of a first dc latch (L1)b and a second dc latch (L2), means interconnecting said shift register latches, a source of A-shift clock pulses coupled to each of said first dc latches (L1), a source of B-shift clock pulses coupled to each of said second dc latches (L2), said level Sensitive Scan Design (LSSD) system of logic including additional circuit means for gating said B-shift clock to at least contain ones of said second latches (L2) whereby said certain ones of said second latches (L2) are utilized in carrying out the logical function of said system of logic.

6. In a level sensitive scan design (LSSD) system of logic, as recited in claim 5 wherein said additional circuit means includes further circuit means including at least a single output terminal for the electronic testing of at least said B-shift clock source, and at least certain ones of said second latch circuits (L2).

7. A functional logic unit for use in a digital computer, or the like, comprising:
   a plurality of latches arranged in groups;
   a means for generating a plurality of clock signal trains coupled to respective groups of said latches for controlling the latches;
   plural networks at least one of which is responsive to a set of unit input signals with each such network providing a set of network signal indications;
   means coupling the sets of network signal indications to respective groups of latches such that the indications are latched in the respective groups under the control of the respective clock signal trains;
   means coupling the outputs of the respective groups of latches as sets of inputs to all networks except a network coupled to a latch group controlled by the same clock signal train;
   means coupling the outputs of the latch groups for providing a logic unit output indication that is a function of said set of unit input signals and said indications in the respective groups of latches;

wherein each of the latches is a shift register latch and wherein the unit further comprises means coupling all of said latches together as a shift register, said coupling means including access means providing access to and from said shift register independent of said set of unit input signals, and said logic unit output indication; and test circuit means connected between said shift register and a single output test terminal, whereby provision is made for testing said clock signal generating means.

8. A logical system, said logical system including at least two interconnected functional logic units, each of said at least two functional logic units comprising:

a plurality of latches;

means for generating a plurality of clock signal trains selectively coupled to said latches for controlling the latches;

plural logical combinational networks at least one of which is responsive to a set of unit input signals with each such network providing a set of network signal indications;

means coupling the sets of network signal indications selectively to at least certain of said latches such that the indications are latched therein under the control of the respective clock signal trains;

means coupling at least certain of the outputs of said latches as sets of inputs to all networks except a network controlled by the same clock signal train;

output means coupled to at least certain of said plurality of latches and at least certain of said logical combinational networks for providing a functional logic unit output;

additional logical circuitry interconnecting at least certain of said plurality of latches with an output terminal; each of said at least two functional logic units being contained on a single semiconductor chip; each of said semiconductor chips being electronically packaged on a packaging structure such as a printed circuit board or multi-layer ceramic structure; and said packaging structure including a single output connected to the output terminal of the additional logical circuitry of each of said at least two interconnected functional logic units.

9. A level sensitive logic system, said system comprising:

a set of primary input terminals (S):

a first combinational netowrk (1), said first combinational network having a first set of input terminals, a second set of input terminals, a first set of output terminals (E1) and a second set of output terminals (G1);

a second combinational network (4) said second combinational network having a first set of input terminals, a second set of input terminals, first set of output terminals (E2) and a second set of output terminals (G2);

a third combinational network (9) of said third combinational network having a first set of input terminals, a second set of input terminals, a third set of input terminals and a set of output terminals (R);

a first shift register latch set (3) said first shift register latch set having a first set of input terminals, a second set of input terminals, at least one additional input terminal, a set of output terminals, at least one additional output terminal, a terminal for receiving an A-Shift clock, and a terminal for receiving a B-Shift clock;

a second shift register lunch set (6) said second shift register latch set having a first set of input terminals, a second set of input terminals, at least one additional input terminal, a set of output terminals, at least one additional output terminal, a terminal for receiving an A-Shift clock, and a terminal for receiving a B-Shift clock;

connection means interconnecting said set of primary input terminals, said first set of input terminals of said first combinational network, said first set of input terminals of said second combinational network and said first set of input terminals of said third combinational network;

connection means interconnecting said first set of outputs of said shift register latch set, said second set of inputs of said third combinational network and said second input set of said second combinational network;

connection means interconnecting said first set of outputs of said second shift register latch set, said second set of inputs of said first combinational network and said third set of inputs of said third combinational network;

connection means connecting said first set of output terminals of said first combinational network with said first set of input terminals of said first shift register latch set;

connection means connecting said first set of output terminals of said second combinational network with said first set of input terminals of said second shift register latch set;

a first clock source (C1) having an output terminal;

a second clock source (C2) having an output terminal;

first AND second set of output terminals of said first combinational network, an input connected to said output terminal of said first clock source and an output set of terminals connected to said second set of input terminals of said first shift register latch set;

second AND circuit means having a set of inputs connected to said second set of output terminals of said second combinational network, an input connected to output terminal of said second clock source, and an output set of terminals connected to said second set of input terminals of said second shift register latch set;

an A-shift clock source having an output terminal;

a B-shift means connecting said output terminal of said A-shift clock source to said A-shift clock terminals of said first and second shift register latch sets;

gated connected means connecting said output terminal of said B-shift clock source to said B-shift clock terminals of said first and second shift register latch sets;

a scan-in terminal connected to said additional input terminal of said second shift register latch set;

connection means connecting said additional output terminal of said second shift register latch set to said additional input terminal of said first shift register latch set;

a scan-out terminal connected to said additional output terminal of said first shift register latch set;

a test B-shift clock output terminal;

and, test B-shift clock circuitry connecting said first and second shift register latch sets to said test B-shift clock output terminal.

10. A level sensitive logic system as recited in claim 9, wherein said first and second shift register latch sets respectively include at least a first dc latch (L1) and a second dc latch (L2) and said test B-shift clock circuitry connects said dc latches (L1) and said dc latches (L2) to said test B-shift clock output terminal.

11. In level sensitive logic sensitive logic system as recited in claim 10, wherein said test B-shift clock circuitry comprises AND circuit means.

12. In a level sensitive logic system; said level sensitive logic system including:
   n shift register latches, where n is an integer number having a range of 2 through 10;
   each of said n shift register latches including interconnected first (L1) and second (L2) dc latches;
   a source of B shift clock pulses;
   gating means connecting said source of B shift clock pulses to each of said second (L2) latches of said n shift register latches;
   n AND circuits, each of said n AND circuits having, an output, an input connected to the first (L1) latch of a discrete one of said n shift register latches and an input connected to said gating means;
   OR circuit means connecting said n outputs of said n AND circuits to a test B shift clock system output terminal.

13. In a level sensitive logic system as recited in claim 12 including:
   a source of A-shift clock pulses;
   gating means connecting said source of A-shift clock pulses to at least certain of said first (L1) latches of said n shift register latches.

14. In a level sensitive logic system as recited in claim 12 including additional second (L2) latches not connected via said gating means to said source of B-shift clock pulses.

* * * * *

UNITED STATES PATENT OFFICE
CERTIFICATE OF CORRECTION

PATENT NO. : 4,071,902
DATED : January 31, 1978
INVENTOR(S) : EDWARD B. EICHELBERGER ET AL.

It is certified that error appears in the above-identified patent and that said Letters Patent are hereby corrected as shown below:

| | |
|---|---|
| Column 6, line 1 | "signals" should read --signal--. |
| Column 6, line 29 | "I" should read --In--. |
| Column 6. line 33 | "(L1)b" should read --(L1)--. |
| Column 6, line 40 | "contain" should read --certain--. |
| Column 6, line 53 | "a means" should read --means--. |
| Column 8, line 3 | "lunch" should read --latch--. |
| Column 8, line 38 | after "first AND" insert --circuit means having a set of inputs connected to said--. |
| Column 8, line 52 | after "a B-shift" insert --clock source having an output terminal; connection-- |
| Column 8, line 56 | change "connected" to read -- --connection-- |
| Column 9, line 11 | after "level sensitive" delete --logic sensitive--. |

Signed and Sealed this

Twenty-second Day of August 1978

[SEAL]

Attest:

RUTH C. MASON
Attesting Officer

DONALD W. BANNER
Commissioner of Patents and Trademarks